United States Patent
Bramm et al.

(10) Patent No.: US 10,433,416 B2
(45) Date of Patent: Oct. 1, 2019

(54) COMPUTER CIRCUIT BOARD COOLING ARRANGEMENT

(71) Applicant: PrimeKey Solutions AB, Solna (SE)

(72) Inventors: Roland Bramm, Aachen (DE); Manuel Dejonghe, Aachen (DE); Martin Oczko, Aachen (DE)

(73) Assignee: PrimeKey Solutions AB, Solna (SE)

( * ) Notice: Subject to any disclaimer, the term of this patent is extended or adjusted under 35 U.S.C. 154(b) by 0 days.

(21) Appl. No.: 15/848,883

(22) Filed: Dec. 20, 2017

(65) Prior Publication Data

US 2018/0177039 A1    Jun. 21, 2018

(30) Foreign Application Priority Data

Dec. 21, 2016 (SE) ...................... 1651714

(51) Int. Cl.
| | | |
|---|---|---|
| *H05K 1/02* | (2006.01) | |
| *H05K 7/20* | (2006.01) | |
| *H05K 9/00* | (2006.01) | |
| *H05K 1/18* | (2006.01) | |

(52) U.S. Cl.
CPC ......... *H05K 1/0209* (2013.01); *H05K 1/0206* (2013.01); *H05K 1/182* (2013.01); *H05K 7/20809* (2013.01); *H05K 9/0024* (2013.01)

(58) Field of Classification Search
CPC ...... H01L 2924/3025; H01L 2924/181; H05K 7/20927; H05K 2201/10106; H05K 1/0203; H05K 1/0209; H05K 1/189; H05K 7/1432; H05K 7/20445; H05K 7/209; H05K 3/284; H05K 7/20336; H05K 1/0206; H05K 1/181; H05K 7/20809; H05K 9/0024
See application file for complete search history.

(56) References Cited

U.S. PATENT DOCUMENTS

| | | |
|---|---|---|
| 5,344,795 A | 9/1994 | Hashemi et al. |
| 5,887,435 A | 3/1999 | Morton |
| 6,029,343 A | 2/2000 | Wieloch |
| 2003/0066637 A1* | 4/2003 | Zimman ............... H01L 23/36 165/185 |
| 2003/0133257 A1* | 7/2003 | Beihoff ............... B60L 11/12 361/600 |

(Continued)

FOREIGN PATENT DOCUMENTS

EP    0632688 A3    7/1995

OTHER PUBLICATIONS

Swedish Office Action dated Mar. 8, 2019, as received in Application No. 1651714-6.

*Primary Examiner* — Adam B Dravininkas
(74) *Attorney, Agent, or Firm* — Schott, P.C.

(57) ABSTRACT

A security arrangement (10) is adapted to improve heat dissipation from circuit board components (12, 14, 16, 18, 20) on a computer circuit board (22), where a plurality of the circuit components (12, 14, 16, 18, 20) are embedded in a security shield (5) and thermally connected to at least one heat exchanger device (24). The heat exchanger device (24) is located at a distance from the security shield (5), and at least a plurality of the circuit components (12, 14, 16, 18, 20) are thermally connected with said at least one heat exchanger device (24) via at least one heat dissipating lead (32, 33, 34) to enhance cooling of the circuit board components (12, 14, 16, 18, 20).

16 Claims, 3 Drawing Sheets

(56) References Cited

U.S. PATENT DOCUMENTS

Figure 1:
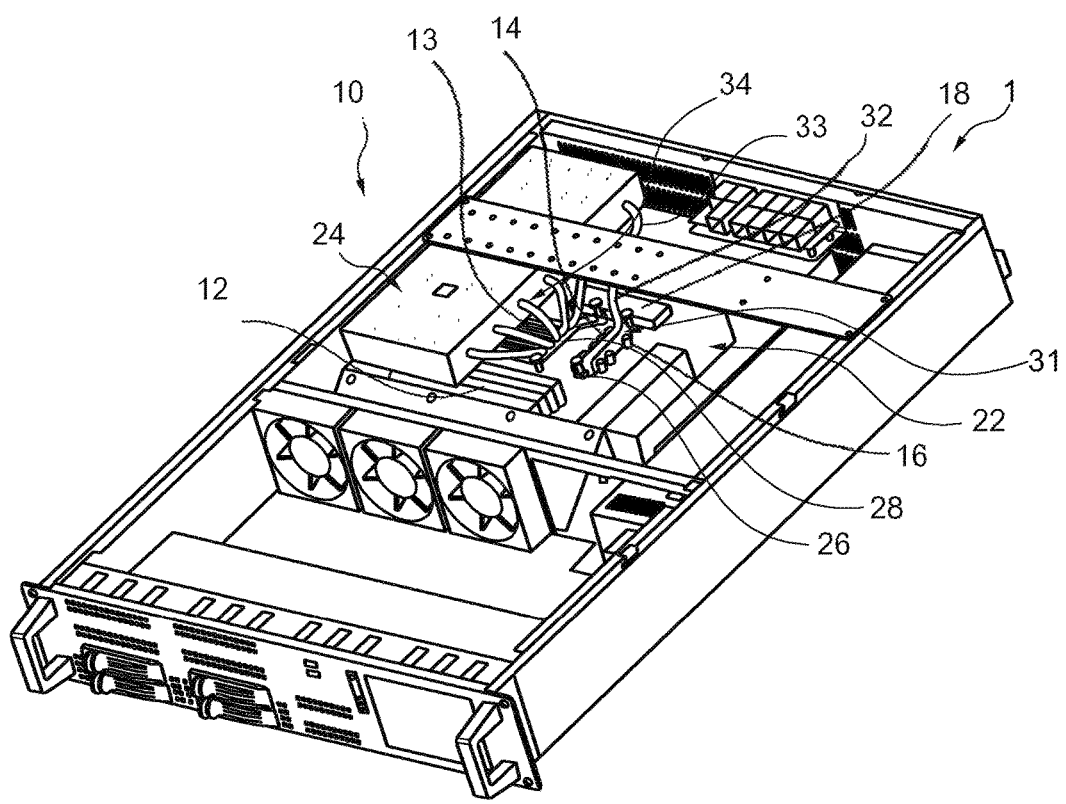

| | | |
|---|---|---|
| 2004/0182088 A1 | 9/2004 | Ghoshal et al. |
| 2005/0207115 A1* | 9/2005 | Barsun ..................... G06F 1/20 361/690 |
| 2005/0243517 A1* | 11/2005 | Malone .................... G06F 1/20 361/699 |
| 2007/0081344 A1* | 4/2007 | Cappaert .............. G02B 6/0085 362/373 |
| 2009/0135563 A1* | 5/2009 | Sakata ................... F16M 11/10 361/697 |
| 2010/0027220 A1* | 2/2010 | Hughes .............. H05K 7/20445 361/702 |
| 2012/0073794 A1 | 3/2012 | Chai |
| 2012/0106083 A1 | 5/2012 | Toftloekke et al. |

\* cited by examiner

US 10,433,416 B2

COMPUTER CIRCUIT BOARD COOLING ARRANGEMENT

TECHNICAL FIELD

The present invention pertains to an arrangement adapted to improve heat dissipation from components on a computer circuit board, attached in the computers casing, via at least one primary heat sink device, leads, and at least a secondary heat sink device.

BACKGROUND ART

In the present technical field it is desired to securely seal hardware on a computer circuit board, and to keep the sealed hardware cooled.

Patent documents U.S. Pat. No. 5,344,795 to Hashemi et al, and U.S. Pat. No. 6,029,343 to Wieloch discloses that it is known to use potting to protect a piece of electronic component, i.e. smaller units in order to handle needed cooling requirements. However, this principle does not always provide a sufficient secure sealing.

From patent application document US2012073794 A1 to Chai, there is known a heat dissipation device mounted above a heat-generating element such as a CPU disposed on a carrier like circuit board. The heat dissipation device includes a block-shaped heat dissipation base provided with a great plurality, stacked, hollow heat conducting pipes. Based on the hollow characteristic of the heat conducting pipes heat dissipation is achieved by convection. However, the design is rather complex and space occupying, which makes it relatively expensive and less compact than is required in many applications. Moreover, it provides no secure sealing. Also, US 20040182088, EP 0632688, US 20050243517 and US 20120106083 disclose a heat dissipation arrangements without providing any secure sealing.

There are known designs where improved security may be provided by means of encasing a plurality of components on a circuit board into one homogenous sealing, combined with using a relatively large conduction heat exchanger on one side of the circuit board. However, this design is relatively costly and also relatively space consuming.

SUMMARY OF THE INVENTION

One aim among others of the present invention is to provide an impoved design for securely sealing hardware on a computer circuit board, and how to keep the sealed hardware cooled, which is achived by means of a slotion as defined in claim 1.

Thanks to the solution according to the invention improved security may be achieved at the same time as good flexibilty is also provided, and in a manner that may facilitate cost efficient production.

According to further aspects of the invention;
said at least one heat dissipating lead may be formed as an elongated heat transferring member, having at least one part attached within said security shield and another part thermally connected to said heat exchanger, which provides the advantage of extra good flexibility of the design.
said at least one heat dissipating lead may form a rod like member having one end thermally connected, preferably in direct contact, to at least one heat sink device in close proximity to at least on of said circuit board components, which provides the advantage of extra good heat dissipation.
a plurality of heat dissipating leads may be arranged between a plurality of said heat sink devices and said heat exchanger, which provides the advantage of extra good flexibility of the design.
said at least one heat dissipating lead may be in the form of a composite or solid rod or pipe having a thermal conductivity, above 200 W/mK.
said at least one heat dissipating lead may form a loop like member, wherein preferably said loop like member is formed by a fluid may be filled tube wherein said fluid is arranged to circulate to achieve cooling, which provides the advantage of extra good cooling in some applications,
said security shield formed by a potting, preferably enclosing all sides of said circuit board, which provides the advantage of extra good security.
said security shield further may secure said components to said circuit board.

A BRIEF DESCRIPTION OF THE DRAWINGS

Figure 2:
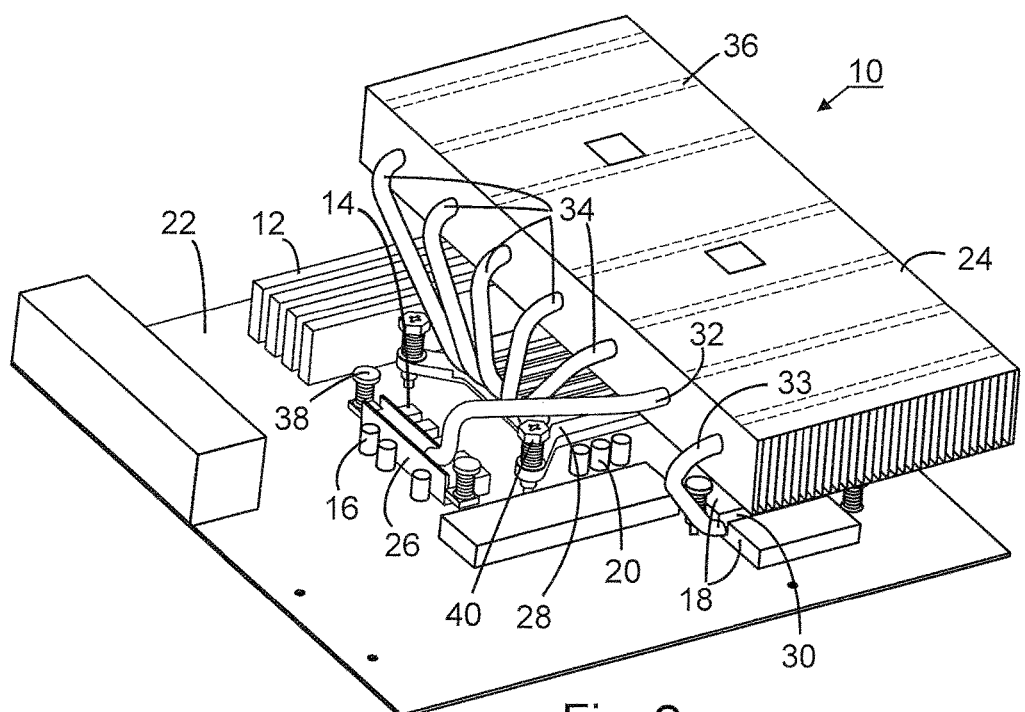
Figure 3:
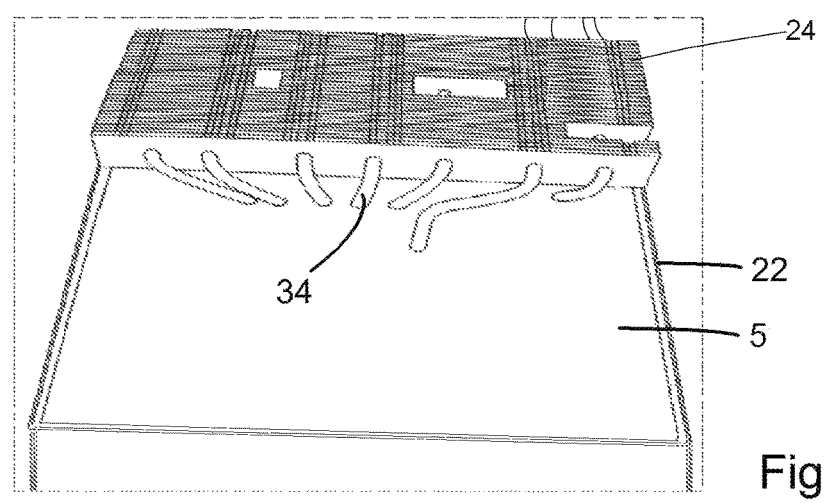
Figure 4:
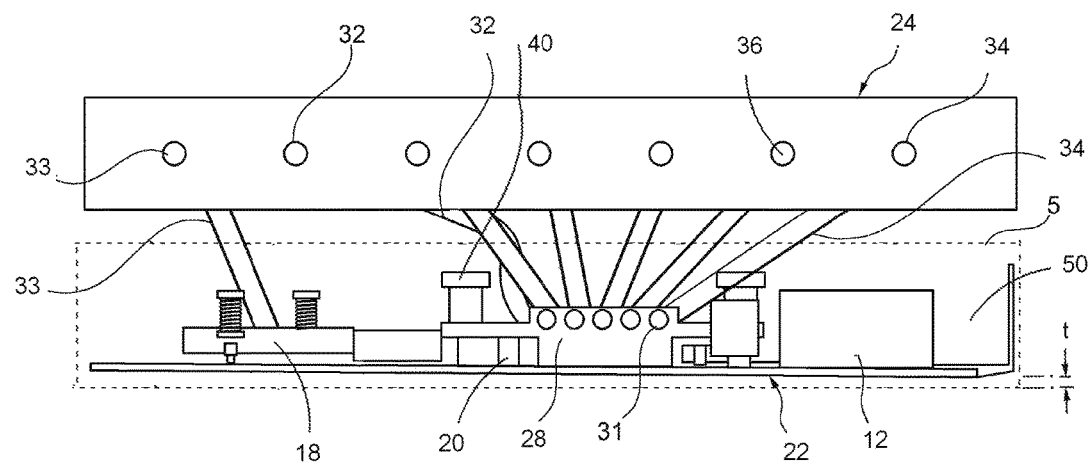
Figure 5:
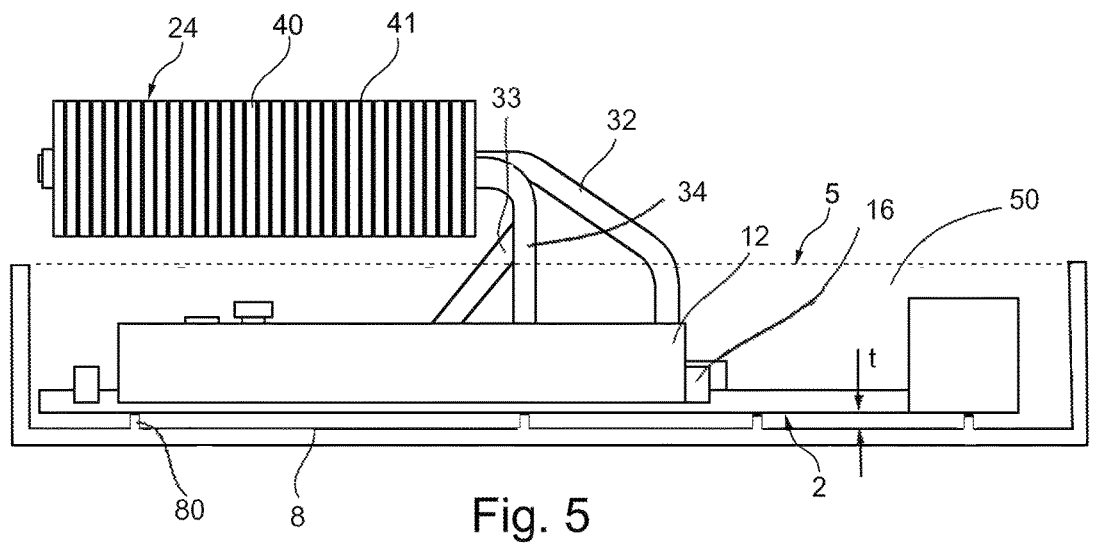

Henceforth, reference is had to the accompanying drawing throughout the present description for a better understanding of the present invention's embodiments, and given examples, wherein:

FIG. 1 schematically illustrates a perspective view from above of an arrangement within a computer casing according to the present invention, wherein the security shield is not shown;

FIG. 2 schematically illustrates a more detailed perspective view from above of the arrangement shown in FIG. 1, FIG. 3 schematically illustrates a perspective view from above of an arrangement of FIG. 2, with a security shield in accordance with the present invention, FIG. 4 schematically illustrates a side view from the back side of an arrangement of FIG. 3, and, FIG. 5 schematically illustrates a side view from the left-hand side of an arrangement of FIG. 3.

DETAILED DESCRIPTION OF PREFERRED EMBODIMENTS

The present invention provides an arrangement 10 that may securely protect electronic hardware on a circuit board 22, comprising a plurality of components/circuits that are completely encapsulated/embedded by a security shield, wherein heat conducting leads/pipes/tubes connect the encapsulated hardware to a distantly positioned heat exchanger. The physical protection of the arrangement of the present invention may easily fulfil with the requirements of FIPS 140-2 Level 3 (Federal Information Processing Standard).

FIG. 1 schematically illustrates the present invention. There is shown a circuit arrangement 10 comprising a computer circuit board 22 within a computer casing/housing 1. Hence, FIG. 1 shows the arrangement 10 with some of a circuit board's 22 conventional hardware components 12, 13, 14, 16, 18, e.g. CPU, RAM, storage, etc, schematically depicted. These components 12, 14, 16, 18 generate heat when operated, which has to be dissipated from the circuit board 22, and the computer casing 1 as known in the art, to avoid malfunction due to overheating.

As also shown in FIG. 1, and in more detail in FIG. 2, the circuit board 22 is connected to at least one heat exchanger device 24. It is appreciated that there could be provided a multiplicity of heat exchanger devices 24 connected to the circuit board 22.

The present invention makes use of at least one, preferably a plurality of heat sink devices 26, 28, 30, which are attached to the circuit board 22 in close proximity to components 12, 14, 16, 18, 20, preferably in tight contact, to efficiently transfer heat away from the components.

Further, the invention protects hardware components 12, 13, 14, 16, 18 from intrusion by means of a security shield 5, since it is well known that hardware, data, software, and firmware can be of interest for manipulation, unauthorized data extraction, blue printing and reverse engineering.

As shown in FIGS. 3, 4 and 5 it is schematically illustrated one embodiment of the present invention, wherein a security shield 5 is arranged. In this embodiment the security shield 5 is in the form of a potting 50 that is applied all around the circuit board 22, entirely covering the hardware components 20, 14, 16, 18, and the back of the circuit board 22, thus totally embedding the circuit board 22, e.g. in epoxy potting. The thickness of the potting is sufficient to safely protect the components from intrusion, i.e. it is sufficiently thick and resistant to secure the component from any intrusion such that even if the layer is destroyed/removed (e.g. by cutting, chiseling) it may practically not be achieved without also damaging the hardware. Hence, the invention efficiently eliminates risks for manipulation, unauthorized data extraction, blue printing and reverse engineering. Further this shield will also make the arrangement 10 water and dust proof, which is an extra advantage, since in the preferred embodiment the security shield 5 totally and hermetically embeds the circuit board 22, with output interfaces (not shown, for connecting cables), preferably integrated in the potting 50.

As shown in more detail in FIGS. 4 and 5, the security shield 5 is arranged all around, i.e. forming a hermetic, preferably water tight, unit. In the preferred embodiment components are only applied to one side of a planar circuit board 22, whereas the opposite side of the shield 5 is clean, whereby it is sufficient to apply a minimum layer, having a preselected thickness t, preferably in the range of 5<t<15 mm. On the component side the thickness will then be much larger, normally between 2 t to 20 t, more preferred 3-10 t.

Further, as indicated in FIG. 5 it may be preferred to use a kind of open or closed box base 8 where the circuit board 22 is positioned prior to embedding in the security shield 5. In case of a potting 50 (e.g. a resin) the box base preferably is arranged with support devices 80 that protrude a desired distance t above the bottom surface of the box base 8, to thereby arrange for a space that will be filled with potting 50, to both provide extra security and to bond the circuit board 22 to the box base 8.

The use of a security shield 5 in accordance with the invention in most applications requires enhanced cooling of the computer circuit board 22 inside the potting 50, due to generally, inherent low thermal conductivity of the design/material of a security shield 5.

For this purpose, the present invention provides leads/pipes/tubes 32, 33, 34 that thermally connect the heat sink devices 26, 28, 30, with the heat exchanger device 24 that is positioned at a distance from the security shield 5.

Thus the secondary heat sink devices 26, 28, 30 are subject to heat conduction (and also some convection) from the components 12, 14, 16, 18, 20, which heat is conducted via the leads/pipes/tubes 32, 33, 34 from inside of the potting 50 to the heat exchanger devices 24, where it is transferred to the surrounding air by means of convection by fins/flanges 40/41 (or similar convection means) of the heat exchanger devices 24.

As depicted in FIG. 2, the heat sink device 26 may in one embodiment be constructed as a U-shaped/formed elongated member, wherein on end of a lead 32 is positioned in between the two verticals of the U, contacting three of the inner surfaces to provide good thermal contact, and having outer sides of the U in contact with components 14, 16. As is evident many different forms of the heat sink device is feasible to fulfil the function, i.e. including numerous other geometrical shapes.

In one other embodiment of the present invention, the heat sink device 28 is formed as an array of parallel elongated U-shaped heat sinks, in contact with components (not shown) positioned under the heat sink 28. Some components 20 that do not produce much heat need not be in direct contact with any heat sink device, but here some proximity to allow heat convection to an adjacent heat sink 28 may be sufficient.

As mentioned, heat dissipation from the circuit board 22 and its components, is achieved by the leads/pipes/tubes 31, 32, 33, 34, which could be of different geometrical shapes, and preferably (at least relatively) bendable/flexible to facilitate easy adaption to different geometries. Thus, the heat absorbed by the heat sink devices 26, 28, 30 is conducted through the leads 31, 32, 33, 34 to the heat exchanger device 24.

Preferably the leads 32, 33, 34 are made of a material with a high thermal conductivity, e.g. at least above 200 W/(mK). By means of this arrangement 10 cooling of the components is sufficiently good to allow a total embedding in a security shield 5.

In many applications it is preferred to use heat pipes, for at least one (or more) of the leads 32, 33, 36. A heat pipe is a heat-transfer device that combines the principles of both thermal conductivity and phase transition to efficiently manage the transfer of heat between two solid interfaces, here between heat sink devices 26, 28, 30 and the heat exchanger device 24. At the hot interface (the end adjacent components) of a heat pipe 32, 33, 36 a liquid in contact with a thermally conductive solid surface (of the heat pipe) turns into a vapor by absorbing heat from that surface. The vapor then travels along the heat pipe to the colder heat exchanger 24 and condenses back into a liquid—releasing the latent heat. The liquid then returns to the hot interface (e.g. through capillary action, or gravity) and the cycle repeats. Due to the very high heat transfer coefficients for boiling and condensation, heat pipes are highly effective thermal conductors. The effective thermal conductivity varies with heat pipe length, but can easily provide above 2000 W/(mK), and in some applications be above 20 kW/(mK). The advantage of heat pipes is that they contain no mechanical moving parts and typically require no maintenance combined with their great efficiency in transferring over many other heat-dissipation mechanisms is.

Besides conventional heat pipes the invention also may in some applications be used with heat pipes that act as a thermal diode, transferring heat in one direction, while acting as an insulator in the other. Further also loop heat pipes (LHP) may be used, i.e. a passive two-phase heat pipe, which can carry higher power over longer distances by having co-current liquid and vapor flow.

Moreover, it is also foreseen that conventional loop pipes may be used, e.g. containing a suitable liquid, wherein the fluid is pumped around to achieve the desired cooling.

Also depicted in the FIGS. is a possible embodiment of how to connect the leads 32, 33, 34 to the heat exchanger devices 24, e.g. by means of through holes 36 in the heat exchanger device 24 that are adapted to provide tight fit for the inserted ends of the leads 32, 33, 34. The connection between the leads and heat sink devices 26, 28, 30 may, as presented for instance be achieved by screws/clips 38, 40, but of course also other means are feasible, e.g. soldering and or glue.

The attached set of claims determines other possible embodiments of the present invention to a person skilled in the art of the present technical field.

According to a modified embodiment that may be used to solve the main problem we below address two principles that may be used in combination with the invention or separately and for which possibly separate protection will be covered in one or more separate divisional applications/s, related to different kinds, other than such described above, of security shields may be used. Specifically, it may refer to having a closed metal or plastic box which encloses the electronic circuits and the heat pipes are lead out thorough holes in the box. Such a box, e.g. via electrical mesh, could be connected to the internal circuit board which would include a kind of a sensor device that could detect the damage of the mesh (change of resistance, broken connections etc) and as a consequence could activate deletion of the data stored inside the circuit board. Further a security shield could also include an (preferably additional) electric mesh that would act as a Faraday cage and shield the electronics towards the outside to prevent eavesdropping based on measuring electromagnetic radiation. The electric mesh may preferably be embedded in a suitable polymer or composite. The metal box alternative may preferably be made from a suitable metal plate (e.g. high strength steel alloy) forming a hard to penetrate housing, e.g. having a wall thickness of 2-10 mm.

The invention claimed is:

1. A security arrangement (10) adapted to improve heat dissipation from circuit board components (12, 14, 16, 18, 20) on a computer circuit board (22), wherein a plurality of said circuit components (12, 14, 16, 18, 20) are embedded in a security shield (5) formed by a potting on at least one surface of said circuit board (22) and thermally connected to at least one heat exchanger device (24), wherein said heat exchanger device (24) is located at a distance from said security shield (5), and that at least a plurality of said circuit components (12, 14, 16, 18, 20) are thermally connected with said at least one heat exchanger device (24) via at least one heat dissipating lead (32, 33, 34) to enhance cooling of said circuit board components (12, 14, 16, 18, 20), wherein said at least one heat dissipating lead (32, 33, 34) is formed as an elongated heat transferring member, having at least one part attached within said security shield (5) and another part thermally connected to said heat exchanger, wherein the at least one heat dissipating lead extends from within the potting to out of the potting.

2. A security arrangement according to claim 1, wherein said at least one heat dissipating lead (32, 33, 34) forms a rod like member having one end thermally connected, in direct contact, to at least one heat sink device (26, 28, 30) in close proximity to at least one of said circuit board components (12, 14, 16, 18, 20).

3. A security arrangement according to claim 2, wherein a plurality of heat dissipating leads (32, 33, 34) are arranged between a plurality of said heat sink devices (26, 28, 30) and said heat exchanger (24).

4. A security arrangement according to claim 2, wherein said at least one heat dissipating lead (32, 33, 34) is in the form of a composite or solid rod or pipe having a thermal conductivity, above 200 W/mK, including at least one metal out of gold, silver or copper.

5. A security arrangement according to claim 1, wherein said at least one heat dissipating lead (32, 33, 34) forms a loop like member.

6. A security arrangement according to claim 5, wherein said loop like member is formed by a liquid filled tube, wherein said liquid is arranged to circulate to achieve cooling.

7. A security arrangement according to claim 1, wherein said security shield (5) is formed by a potting enclosing all sides of said circuit board (22).

8. A security arrangement according to claim 7, wherein said potting is constituted by an epoxy resin.

9. A security arrangement (10) according to claim 1, wherein said security shield (5) further secures said components (12, 14, 16, 18, 20) to said circuit board (22).

10. A security arrangement (10) according to claim 7, wherein said security shield has a minimum thickness (t) that is between 1 mm to 15 mm, and wherein preferably a thickest part of said security shield has a thickness that is between 2 t to 20 t, preferably 3 t to 10 t.

11. A security arrangement (10) according to claim 1, wherein said security shield includes a-substantially enclosing box base.

12. A security arrangement (10) according to claim 11, wherein said box includes or is in the form of a Faraday box, wherein preferably said Faraday box is embedded in a polymer or composite box.

13. A security arrangement (10) according to claim 11, wherein said box includes or is in the form of a metal housing having a wall thickness of 2-10 mm.

14. A computer device (1), comprising a security arrangement (10) according to claim 1.

15. The computer device of claim 1, wherein the security shield secures components from intrusion.

16. A method for providing a security arrangement (10) adapted to improve heat dissipation from circuit board components (12, 14, 16, 18, 20) on a computer circuit board (22), comprising embedding a plurality of said circuit components (12, 14, 16, 18, 20) in a security shield (5) formed by a potting having inherent low thermal conductivity on at least one surface of said circuit board (22) and thermally connecting said circuit components (12, 14, 16, 18, 20) to at least one heat exchanger device (24), by locating said heat exchanger device (24) at a distance from said security shield (5), and thermally connecting at least a plurality of said circuit components (12, 14, 16, 18, 20) with said at least one heat exchanger device (24) via at least one heat dissipating lead (32, 33, 34) to enhance cooling of said secured circuit board components (12, 14, 16, 18, 20), and wherein said at least one heat dissipating lead (32, 33, 34) is formed as an elongated heat transferring member, having at least one part attached within said security shield (5) and another part thermally connected to said heat exchanger, wherein the at least one heat dissipating lead extends from within the potting to out of the potting.

* * * * *